United States Patent
Choi et al.

(10) Patent No.: US 8,952,373 B2
(45) Date of Patent: Feb. 10, 2015

(54) HARDMASK COMPOSITION AND METHOD OF FORMING PATTERNS AND SEMICONDUCTOR INTEGRATED CIRCUIT DEVICE INCLUDING THE PATTERNS

(71) Applicants: Yoo-Jeong Choi, Uiwang-si (KR); Yun-Jun Kim, Uiwang-si (KR); Joon-Young Moon, Uiwang-si (KR); Bum-Jin Lee, Uiwang-si (KR); Chung-Heon Lee, Uiwang-si (KR); Youn-Jin Cho, Uiwang-si (KR)

(72) Inventors: Yoo-Jeong Choi, Uiwang-si (KR); Yun-Jun Kim, Uiwang-si (KR); Joon-Young Moon, Uiwang-si (KR); Bum-Jin Lee, Uiwang-si (KR); Chung-Heon Lee, Uiwang-si (KR); Youn-Jin Cho, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 14/037,722

(22) Filed: Sep. 26, 2013

(65) Prior Publication Data

US 2014/0183701 A1    Jul. 3, 2014

(30) Foreign Application Priority Data

Dec. 27, 2012  (KR) .................. 10-2012-0155332

(51) Int. Cl.
*H01L 21/47*     (2006.01)
*H01L 23/00*     (2006.01)
(Continued)

(52) U.S. Cl.
CPC ............. *H01L 23/564* (2013.01); *G03F 7/11* (2013.01); *H01L 21/02118* (2013.01);
(Continued)

(58) Field of Classification Search
CPC ......................... H01L 21/47; H01L 21/0271
USPC ................................................ 257/618, 40
See application file for complete search history.

(56) References Cited

U.S. PATENT DOCUMENTS

| 8,153,349 B2 | 4/2012 | Cheon et al. |
| 2006/0251990 A1* | 11/2006 | Uh et al. ............. 430/270.1 |
| 2012/0153511 A1* | 6/2012 | Song et al. ............. 257/786 |
| 2012/0168894 A1 | 7/2012 | Kim et al. |

FOREIGN PATENT DOCUMENTS

| JP | 06-145307 | 5/1994 |
| JP | 10-268518 | 10/1998 |

(Continued)

*Primary Examiner* — Marc Armand
(74) *Attorney, Agent, or Firm* — Lee & Morse, P.C.

(57) ABSTRACT

A hardmask composition includes a monomer represented by the following Chemical Formula 1 and an aromatic ring-containing polymer,

[Chemical Formula 1]

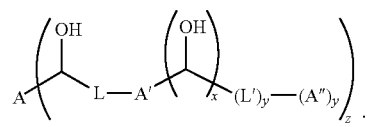

15 Claims, 1 Drawing Sheet

(51) Int. Cl.
*G03F 7/11* (2006.01)
*H01L 21/02* (2006.01)
*H01L 21/027* (2006.01)
*H01L 21/033* (2006.01)

(52) U.S. Cl.
CPC ..... *H01L 21/02282* (2013.01); *H01L 21/0271* (2013.01); *H01L 21/0332* (2013.01)
USPC ............................................ 257/40; 257/618

(56) References Cited

FOREIGN PATENT DOCUMENTS

| | | |
|---|---|---|
| JP | 2010-271654 A | 12/2010 |
| KR | 10-2009-0068444 A | 6/2009 |
| KR | 10-2012-0067602 A | 6/2012 |
| KR | 10-2012-0068379 A | 6/2012 |
| KR | 10-2012-0073817 A | 7/2012 |
| KR | 10-2012-0077466 A | 7/2012 |
| TW | 201229672 | 7/2012 |

* cited by examiner

HARDMASK COMPOSITION AND METHOD OF FORMING PATTERNS AND SEMICONDUCTOR INTEGRATED CIRCUIT DEVICE INCLUDING THE PATTERNS

CROSS-REFERENCE TO RELATED APPLICATION

Korean Patent Application No. 10-2012-0155332, filed on Dec. 27, 2012, in the Korean Intellectual Property Office, and entitled: "Hardmask Composition and Method of Forming Patterns and Semiconductor Integrated Circuit Device Including the Patterns," is incorporated by reference herein in its entirety.

BACKGROUND

1. Field

Embodiments relate to a hardmask composition, a method of forming patterns using the same, and a semiconductor integrated circuit device including the patterns.

2. Description of the Related Art

The semiconductor industry has developed an ultra-fine technique for providing a pattern of several to several tens nanometer size. Such an ultrafine technique benefits from effective lithographic techniques.

A typical lithographic technique includes providing a material layer on a semiconductor substrate, coating a photoresist layer thereon, exposing and developing the same to provide a photoresist pattern, and etching the material layer using the photoresist pattern as a mask.

According to small-sizing of the pattern to be formed, it may be difficult to provide a fine pattern having a desirable profile by only above-mentioned typical lithographic technique. Accordingly, a layer, called a hardmask layer, may be formed between the material layer and the photoresist layer to provide a fine pattern.

SUMMARY

Embodiments are directed to a hardmask composition, including a monomer represented by the following Chemical Formula 1 and an aromatic ring-containing polymer,

[Chemical Formula 1]

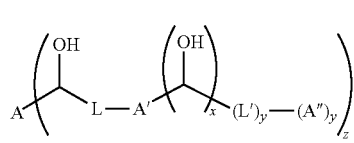

In the above Chemical Formula 1,

A, A' and A" may each independently be a substituted or unsubstituted aromatic cyclic group or aliphatic cyclic group, provided that at least one of the A and A' is a substituted or unsubstituted pyrene group, a substituted or unsubstituted perylene group, a substituted or unsubstituted benzoperylene group, a substituted or unsubstituted coronene group, or a combination thereof, L and L' may each independently be a single bond or a substituted or unsubstituted C1 to C6 alkylene group, x and y may be 0 or 1, and z may be an integer of 1 to 5.

At least one hydrogen of the A' or A" may be substituted with a hydroxy group.

The monomer may be represented by the following Chemical Formula 1-1, 1-2, or 1-3:

[Chemical Formula 1-1]

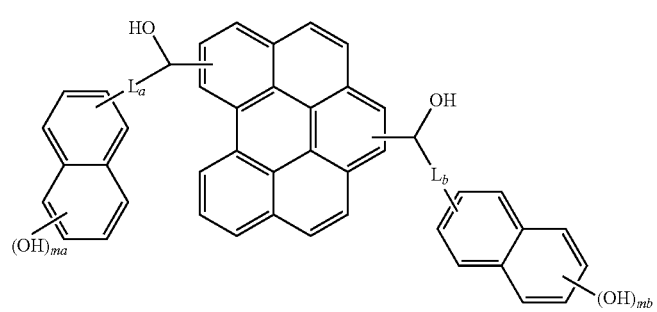

[Chemical Formula 1-2]

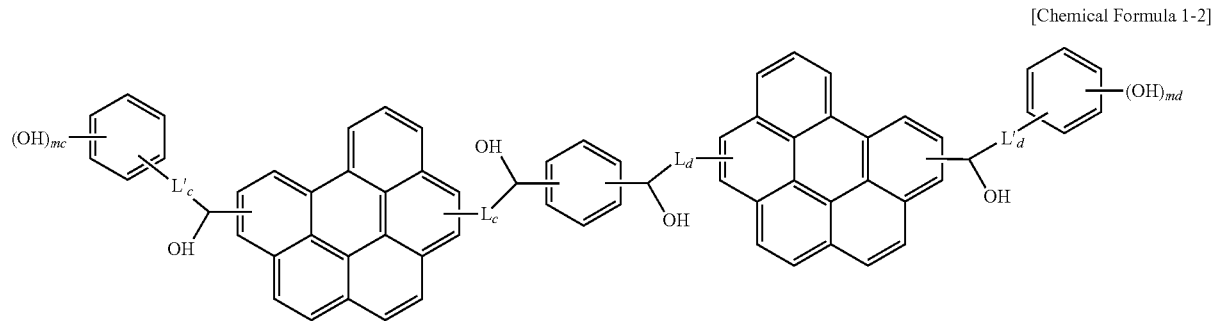

[Chemical Formula 1-3]

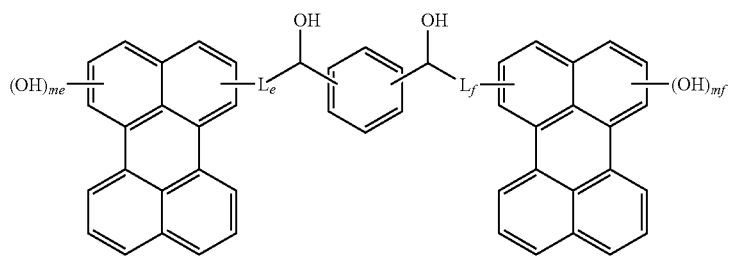

In the above Chemical Formulae 1-1, 1-2, and 1-3,
La, Lb, Lc, Ld, Le, Lf, L'c, and L'd may each independently be a single bond or a substituted or unsubstituted C1 to C6 alkylene group, ma and mb may each independently be integers of 0 to 7, mc and md may each independently be integers of 0 to 5, and me and mf may each independently be integers of 0 to 11.

The monomer may be represented by the following Chemical Formula 1-1a, 1-1b, 1-2a, or 1-3a:

[Chemical Formula 1-1a]

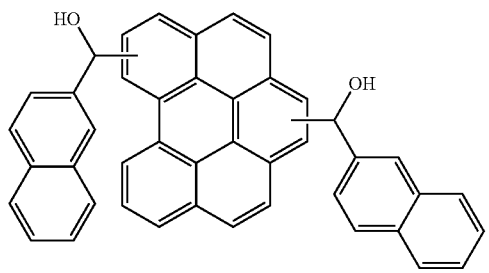

[Chemical Formula 1-1b]

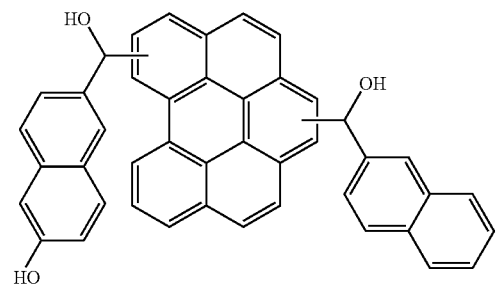

[Chemical Formula 1-2a]

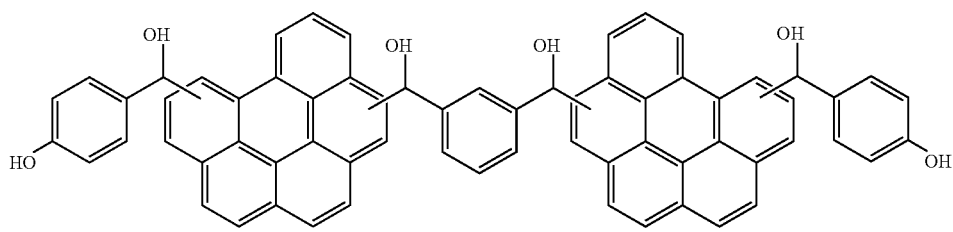

[Chemical Formula 1-3a]

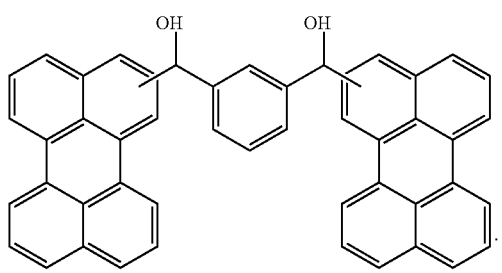

The aromatic ring-containing polymer may include a moiety represented by the following Chemical Formula 2:

[Chemical Formula 2]

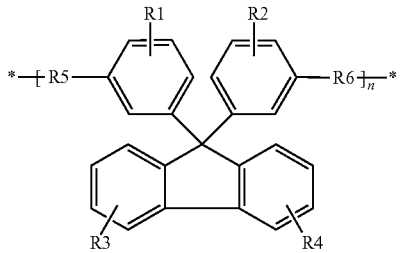

In the above Chemical Formula 2,

R1 to R4 may each independently be hydrogen, a hydroxy group, a substituted or unsubstituted C1 to C20 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C20 alkoxy group, a halogen, a halogen-containing group, or a combination thereof, R5 and R6 may each independently be a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C7 to C20 arylalkylene group, a substituted or unsubstituted C1 to C20 heteroalkylene group, a substituted or unsubstituted C2 to C20 heterocycloalkylene group, or a combination thereof, and n may be 3 to about 200.

The hardmask composition may further include a solvent, and the monomer and the aromatic ring-containing polymer may be included in an amount of about 1 part by weight to about 40 parts by weight and about 1 part by weight to about 20 parts by weight, respectively, based on 100 parts by weight of the solvent.

The monomer and the aromatic ring-containing polymer may be present at a weight ratio of monomer:polymer of about 1:1 to about 9:1.

The monomer may have a molecular weight of about 500 to about 3,000.

The aromatic ring-containing polymer may have a weight average molecular weight of about 1,000 to about 10,000.

The hardmask composition may further include a solvent, and the solvent may include one or more of propyleneglycol monomethylether acetate, propyleneglycol monomethyl ether, cyclohexanone, or ethyl lactate.

Embodiments are also directed to a method of forming patterns, the method including providing a material layer on a substrate, forming a hardmask layer on the material layer, forming the hardmask layer including applying the hardmask composition according to an embodiment on the material layer, forming a resist layer on the hardmask layer, exposing and developing the resist layer to form a resist pattern, selectively removing the hardmask layer using the resist pattern to expose a part of the material layer, and etching an exposed part of the material layer.

The hardmask composition may be applied using a spin-on-coating method.

Before forming the resist layer, a silicon-containing auxiliary layer may be formed on the material layer.

Before forming the hardmask layer, a bottom antireflective coating may be formed.

Embodiments are also directed to a semiconductor integrated circuit device including a plurality of patterns manufactured according to the method according to an embodiment.

BRIEF DESCRIPTION OF THE DRAWINGS

Features will become apparent to those of skill in the art by describing in detail example embodiments with reference to the attached drawings in which.

DETAILED DESCRIPTION

Figure 1:
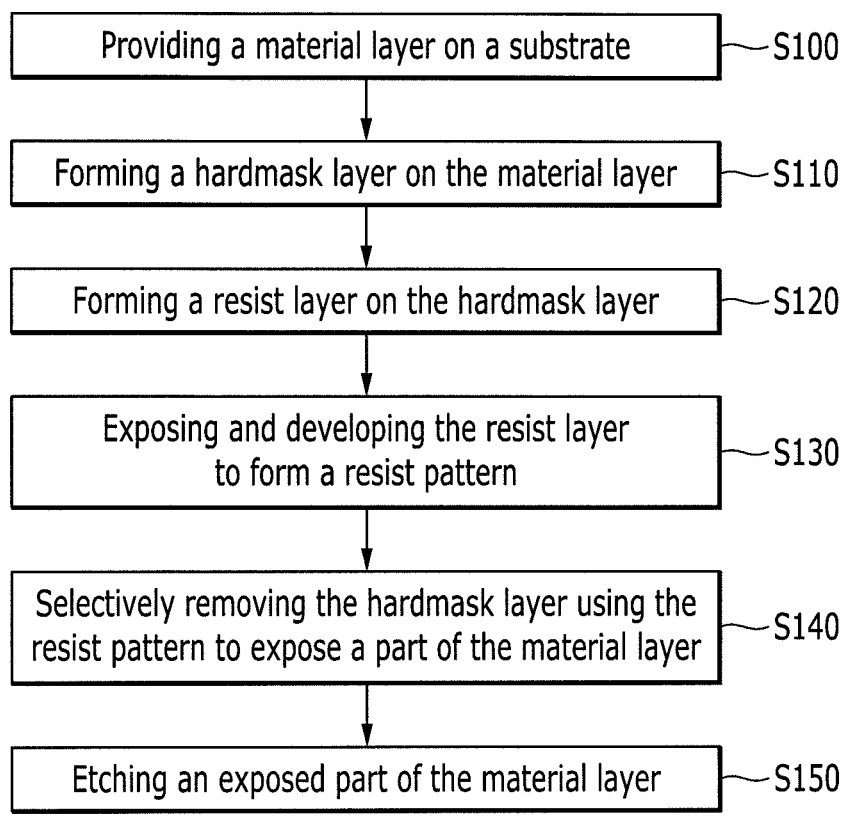
FIG. 1 illustrates a flow chart of a method according to an example embodiment.

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art. Like reference numerals refer to like elements throughout.

As used herein, when a definition is not otherwise provided, the term 'substituted' refers to one substituted with at least a substituent selected from a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C4 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of hydrogen of a compound.

As used herein, when a definition is not otherwise provided, the prefix 'hetero' refers to one including 1 to 3 heteroatoms selected from N, O, S, and P Hereinafter, a hardmask composition according to an example embodiment is described.

According to an example embodiment, a hardmask composition includes a monomer represented by the following Chemical Formula 1 and an aromatic ring-containing polymer.

[Chemical Formula 1]

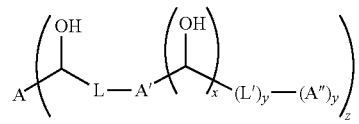

In the above Chemical Formula 1,

A, A' and A" are each independently a substituted or unsubstituted aromatic cyclic group or aliphatic cyclic group, L and L' are each independently a single bond or a substituted or unsubstituted C1 to C6 alkylene group, x=y=0 or x=y=1, and z is an integer of 1 to 5. It will be understood that, where z is greater than 1, the plurality of moieties indicated by z may be the same or different.

In an implementation, at least one of the A and A' is a substituted or unsubstituted pyrene group, a substituted or unsubstituted perylene group, a substituted or unsubstituted benzoperylene group, a substituted or unsubstituted coronene group, or a combination thereof.

At least one of a core moiety and a substituted moiety of the monomer may include a polycyclic aromatic group such as a substituted or unsubstituted pyrene group, a substituted or unsubstituted perylene group, a substituted or unsubstituted benzoperylene group, a substituted or unsubstituted coronene group, and the like. The monomer having such a structure may have rigid characteristics.

At least one hydrogen of the aromatic cyclic group or aliphatic cyclic group positioned at the substituted moiety of the monomer may be substituted with a hydroxy group. Accordingly, the monomer may have excellent cross-linking characteristics.

According to an example embodiment, the monomer may be represented by the following Chemical Formula 1-1, 1-2, or 1-3.

[Chemical Formula 1-1]

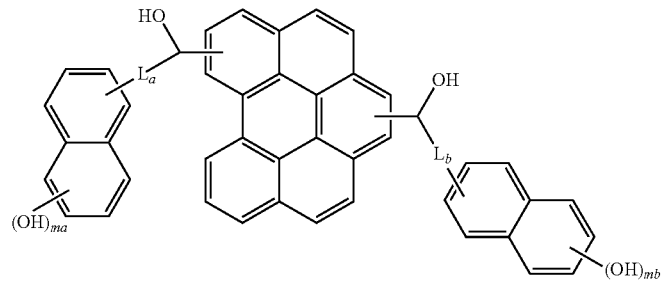

[Chemical Formula 1-2]

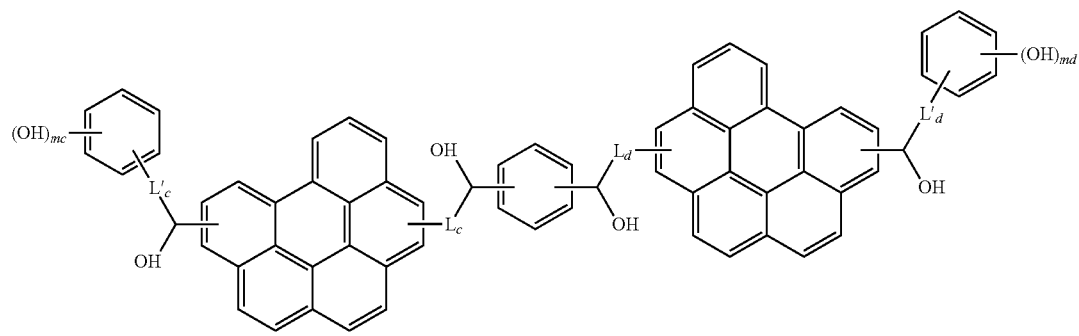

[Chemical Formula 1-3]

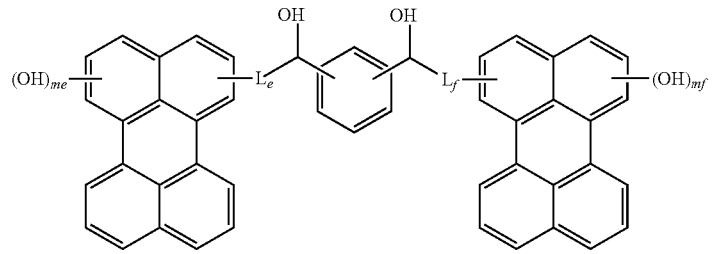

In the above Chemical Formulae 1-1, 1-2 and 1-3,
La, Lb, Lc, Ld, Le, Lf, L'c, and L'd are a single bond or a substituted or unsubstituted C1 to C6 alkylene group,
ma and mb are each independently integers of 0 to 7,
mc and md are each independently integers of 0 to 5, and
me and mf are each independently integers of 0 to 11.

In an example embodiment, the monomer may be represented by the following Chemical Formula 1-1a, 1-1b, 1-2a, or 1-3a.

[Chemical Formula 1-1a]

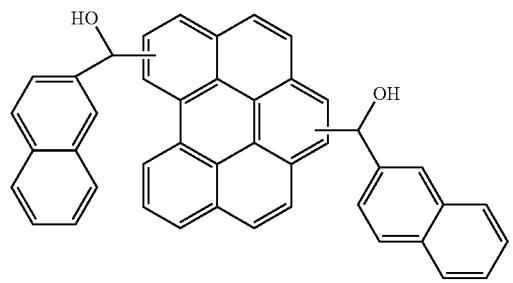

[Chemical Formula 1-1b]

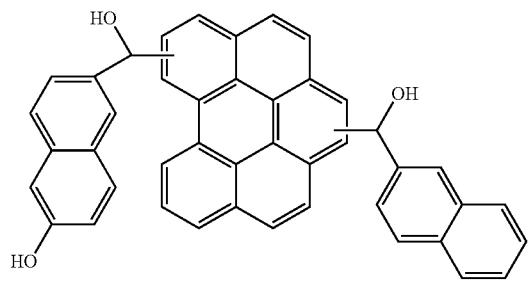

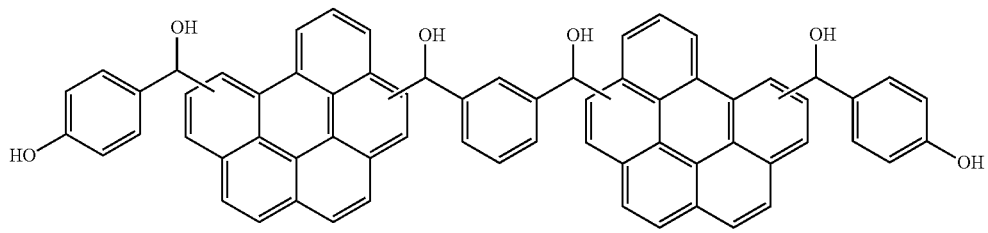

[Chemical Formula 1-2a]

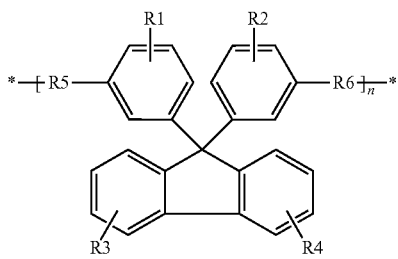

[Chemical Formula 1-3a]

In an implementation, the monomer may have a molecular weight of about 500 to about 3,000.

According to an example embodiment, the aromatic ring-containing polymer component of the hardmask composition may include a moiety represented by the following Chemical Formula 2.

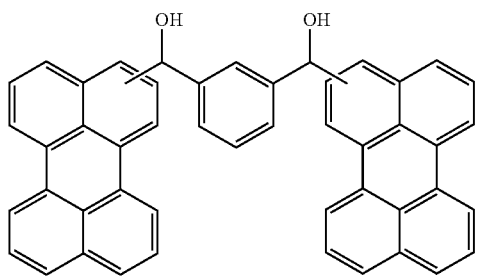

[Chemical Formula 2]

In the above Chemical Formula 2,

R1 to R4 are each independently hydrogen, a hydroxy group, a substituted or unsubstituted C1 to C20 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C20 alkoxy group, a halogen, a halogen-containing group, or a combination thereof, R5 and R6 are each independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C7 to C20 arylalkylene group, a substituted or unsubstituted C1 to C20 heteroalkylene group, a substituted or unsubstituted C2 to C20 heterocycloalkylene group, or a combination thereof, and n is 3 to about 200.

In an example embodiment, the hardmask composition includes the polymer and the monomer. A hardmask layer formed by using the hardmask composition may provide etch resistance as well as improved gap-fill characteristics.

According to an example embodiment, the hardmask composition further includes a solvent. The monomer and the polymer may be included in an amount of about 1 part by weight to about 40 parts by weight and about 1 part by weight to about 20 parts by weight, respectively, based on 100 parts by weight of the solvent.

The monomer and the polymer may be present at a weight ratio of monomer:polymer of about 1:1 to about 9:1. When the monomer and the polymer are combined within the range, a hardmask layer may be formed with little or no voids, and may produce less out-gas at a high temperature.

The polymer may have a weight average molecular weight of about 1,000 to about 10,000, e.g., about 3,000 to about 10,000. The polymer having a weight average molecular weight within the range may secure appropriate dissolution and improve a planarization degree of a hardmask layer formed using the composition.

The solvent may include one or more of propyleneglycol monomethylether acetate (PGMEA), propyleneglycol monomethyl ether (PGME), cyclohexanone, or ethyl lactate.

The hardmask composition according to an example embodiment includes the monomer represented by the above Chemical Formula 1 and the aromatic ring-containing polymer represented by the above Chemical Formula 2. The hardmask composition may exhibit improved gap-fill characteristics and planarization characteristics, and may provide a hardmask layer that exhibits improved chemical resistance, heat resistance, and etch resistance. In an implementation, the hardmask composition may used for a process such as a dual damascene process, e.g., a via-first dual damascene process.

In an example embodiment, the hardmask composition may include an additive, e.g., one or more of a surfactant, a cross-linking agent, or the like.

The surfactant may include, for example, one or more of an alkylbenzenesulfonate salt, an alkylpyridinium salt, a polyethylene glycol, a quaternary ammonium salt, etc.

The cross-linking agent may be used to enhance self cross-linking and may include, e.g., an amino resin, e.g., an etherified amino resin; a glycoluril compound, e.g., a compound represented by the following Chemical Formula a1 or a2; a bisepoxy compound, e.g., a compound represented by the following Chemical Formula b; a melamine resin, e.g., N-methoxymethyl melamine resin, N-butoxymethyl melamine resin, or a compound represented by the following Chemical Formula c; or a mixture thereof.

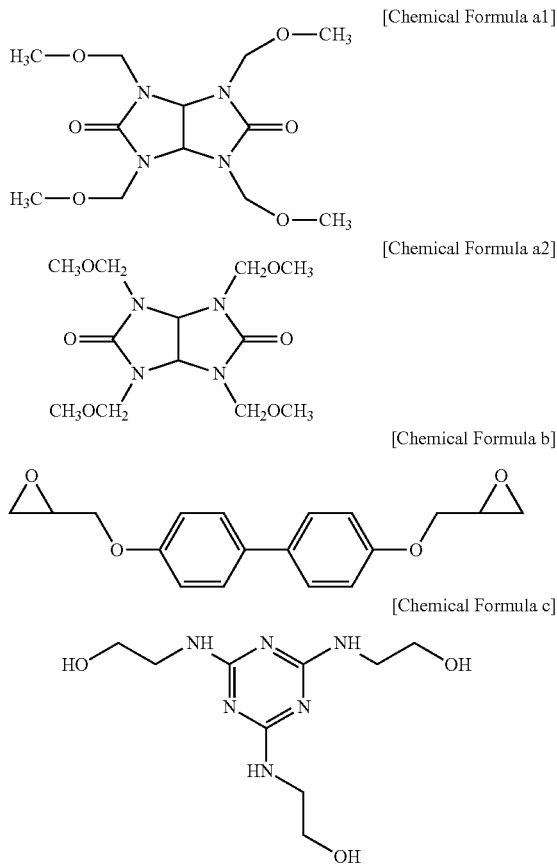

[Chemical Formula a1]

[Chemical Formula a2]

[Chemical Formula b]

[Chemical Formula c]

The surfactant and cross-linking agent may be included in each amount of about 0.001 to about 3 parts by weight based on 100 parts by weight of the resist underlayer composition. Within this amount range, solubility, and cross-linking may be provided while maintaining the optical properties of the hardmask composition.

Hereafter, a method for forming patterns by using the above-described hardmask composition according to an example embodiment is described with reference to FIG. 1.

A method of forming patterns according to an example embodiment includes providing a material layer on a substrate (S100), applying the hardmask composition according to an embodiment, including an aromatic ring-containing polymer, a monomer, and a solvent, on the material layer and forming a hardmask layer on the material layer (S110), forming a resist layer on the hardmask layer (S120), exposing and developing the resist layer to form a resist pattern (S130), selectively removing the hardmask layer using the resist pattern to expose a part of the material layer (S140), and etching an exposed part of the material layer (S150).

The substrate may be, for example, a silicon wafer, a glass substrate, or a polymer substrate.

The material layer is a material to be finally patterned and may be, for example a metal layer such as an aluminum layer or a copper layer, a semiconductor layer such as a silicon layer, or an insulation layer such as a silicon oxide layer or a silicon nitride layer. The material layer may be formed through a method such as a chemical vapor deposition (CVD) process.

The hardmask composition may be applied by spin-on coating in a form of a solution. Forming the hardmask layer may include heat treating the applied composition.

The coating thickness of the hardmask composition and the conditions of the heat treatment are not specifically limited. For example, the hardmask composition may be applied in a thickness of about 500 Å to about 30,000 Å, and the heat treatment may be performed at about 100 to about 500° C. for about 10 seconds to about 10 minutes.

Before the hardmask layer is formed, an auxiliary layer may be formed. The auxiliary layer may be a silicon-containing thin film. For example, the auxiliary layer may be a thin film formed of silicon nitride or silicon oxide.

Also, before the formation of the auxiliary layer, a bottom anti-reflective coating (BARC) layer may be formed.

A resist layer may be applied onto the hardmask layer. The resist layer may be a radioactive ray-sensitive imaging layer including a photosensitive material. A resist pattern may be formed by exposing and developing the resist layer.

Subsequently, the hardmask layer may be selectively removed using the resist pattern as a mask. When the auxiliary layer and/or the bottom anti-reflective coating layer are formed, they may be removed together. As a result, a portion of the material layer may be exposed.

Subsequently, the exposed portion of the material layer may be etched. The etching may be performed through, e.g., a dry etching process using an etching gas, and the etching gas may be, e.g., $CHF_3$, $CF_4$, $CH_4$, $Cl_2$, $BCl_3$, or a mixed gas thereof.

Subsequently, a plurality of patterns formed from the material layer may be formed by removing the hard mask layer and the resist layer with a stripper.

The plurality of patterns may be diverse, such as a metal pattern, a semiconductor pattern, or an insulation pattern, and they may be diverse patterns inside a semiconductor integrated circuit device. When the semiconductor integrated circuit device includes the patterns, the patterns may be, for example, metal lines, semiconductor patterns, or insulation layers including contact holes, bias holes, or damascene trenches.

According to another example embodiment, a semiconductor integrated circuit device including a plurality of pattern formed using the method of forming patterns is provided.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Monomer

Synthesis Example 1

27.6 g (0.1 mol) of benzoperylene and 42 g (0.22 mol) of naphthoyl chloride along with 500 g of a chloroform/dichloromethane mixed solution were put in a 2 L 3-necked flask and agitated with a stirring magnetic bar, and 61.2 g (0.35 mol) of aluminum chloride was added little by little thereto for a reaction. When the reaction was complete, water was used to remove trichloro aluminum. The obtained reactant as a powder was dissolved in tetrahydrofuran, and 18.98 g (0.5 mol) of lithium aluminum hydride was added little by little thereto for a reaction. When the reaction was complete, a mixture of water/methanol was used to remove a reaction byproduct, obtaining a compound represented by the following Chemical Formula 1-1a.

[Chemical Formula 1-1a]

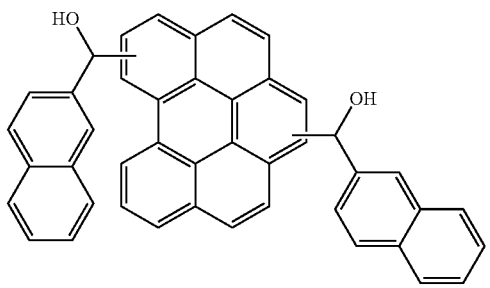

Synthesis Example 2

27.6 g (0.1 mol) of benzoperylene and 23.5 g (0.11 mol) of methoxy naphthoyl chloride along with 500 g of a chloroform/dichloromethane mixed solution were put in a 2 L 3-necked flask and agitated with a stirring magnetic bar, 36.7 g (0.15 mol) of aluminum chloride was added little by little thereto, and the mixture was reacted at room temperature. One hour later, 21 g (0.11 mol) of naphthoyl chloride was added to the reactant, and 36.7 g (0.15 mol) of aluminum chloride was additionally added thereto. When the reaction was complete, water was used to remove trichloro aluminum, then, the obtained reactant as a powder along with 60 g (1 mol) of acetic acid and 48.5 g (0.6 mol) of hydrogen bromide was put in a 500 mL 3-necked flask and reacted at 130° C. for 6 hours. When the reaction was complete, water was added thereto, obtaining a reactant as a powder. The reactant was dissolved in tetrahydrofuran, and 18.98 g (0.5 mol) of lithium aluminum hydride was added little by little thereto for a reaction. When the reaction was complete, a water/methanol mixture was used to remove a byproduct, obtaining a compound represented by the following Chemical Formula 1-1b.

[Chemical Formula 1-1b]

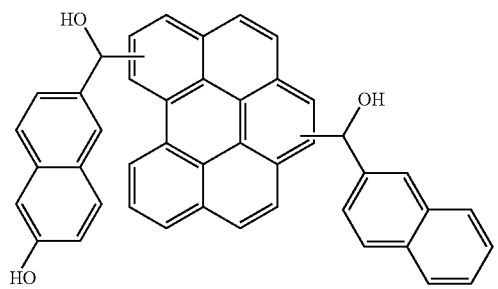

Synthesis Example 3

29.0 g (0.105 mol) of benzoperylene and 17.06 g (0.1 mol) of methoxybenzoyl chloride along with 370 g of dichloromethane were put in a 1 L 3-necked flask and agitated with a stirring magnetic bar, and 14.67 g (0.11 mol) of aluminum chloride was added little by little thereto at room temperature for a reaction. When the reaction was complete after agitating the mixture for 1 hour, 10.15 g (0.05 mol) of isophthaloyl chloride was further added thereto, and 29.33 g (0.22 mol) of aluminum chloride was added little by little thereto, while the mixture was agitated. Here, the reaction was exothermic and thus, performed in an ice bath for 3 hours. When the reaction was complete, the reactant was added to water, and the obtained powder was filtered and dried.

The dried reactant along with 7 g (0.125 mol) of potassium hydroxide and 20 g (0.1 mol) of dodecane thiol was put in a 1 L flask, 270 g of dimethylformamide was added thereto, and then the mixture was agitated at 100° C. for 12 hours. When the reaction was complete, the reactant was cooled down to 50° C., 37.83 g (1 mol) of sodium borohydride was added little by little thereto, and the mixture was agitated for 18 hours. When the reaction was complete, the reactant was neutralized to pH 6 by using a 7% hydrogen chloride solution, and ethyl acetate was used to remove a reaction byproduct, obtaining a monomer represented by the following Chemical Formula 1-2a.

[Chemical Formula 1-2a]

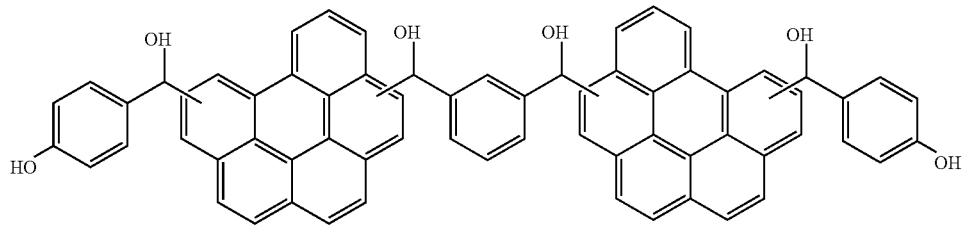

Synthesis Example 4

26.5 g (0.105 mol) of perylene and 10.15 g (0.05 mol) of isophthaloyl chloride were put in a 1 L 3-necked flask and agitated, and 29.33 g (0.22 mol) of aluminum chloride added little by little thereto for a reaction. Here, the reaction was exothermic and thus, performed in an ice bath for 2 hours. When the reaction was complete, water was added to the reactant to obtain a powder-type reactant, and the reactant was filtered and dried.

The dried powder and 270 g of dimethylformamide were put in a 1 L flask, and 37.83 g (1 mol) of sodium borohydride was added little by little thereto. When the addition was complete, the mixture was agitated at 50° C. for 18 hours. When the reaction was complete, a 7% hydrogen chloride solution was used to neutralize the reactant to pH 6, and ethyl acetate was used to remove a reaction byproduct, obtaining a monomer represented by the following Chemical Formula 1-3a.

[Chemical Formula 1-3a]

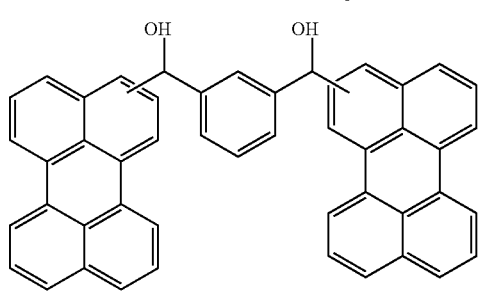

Synthesis of Polymer

Polymerization Example 1

A 1 L 3-necked flask equipped with a thermometer, a condenser, and a mechanical agitator was prepared. 8.75 g (0.05 mol) of α,α'-dichloro-p-xylene, 26.6 g (0.11 mol) of aluminum chloride, and γ-butyrolactone were put in the 3-necked flask and sufficiently agitated, while nitrogen gas was blown into the flask. 10 minutes later, a solution prepared by dissolving 35.03 g (0.10 mol) of 4,4'-(9-fluorenylidene) diphenol in 200 g of γ-butyrolactone was slowly added to the reactant in a dropwise fashion, and the reaction was heated up to 110° C. and agitated and reacted for about 8 hours. When the reaction was complete, water was used to remove acid from the reactant, and the resultant was concentrated with an evaporator. Then, methylamylketone (MAK) and methanol were used to dilute the concentrated reactant, and a 15 wt % MAK/methanol (a weight ratio=4/1) solution was used for adjustment. The solution was put in a separatory funnel, and n-heptane was added thereto to remove low moleculars including a monomer, obtaining a polymer represented by the following Chemical Formula 3.

The polymer represented by the following Chemical Formula 3 had a weight average molecular weight of 6500, polydispersity of 2.2, and n of 13.

[Chemical Formula 3]

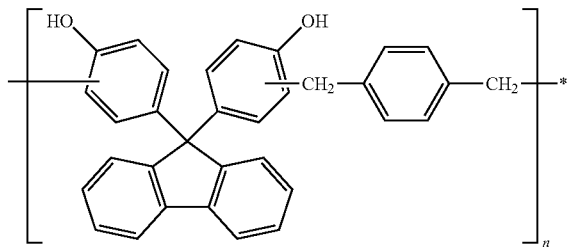

Preparation of Hardmask Composition

Example 1

The monomer according to Synthesis Example 1 and the polymer according to Polymerization Example 1 were dissolved in a mixed solvent of propyleneglycol monomethyl etheracetate (PGMEA) and propyleneglycol monomethyl ether (PGME) at a ratio of 7:3 (v/v), and the solution was filtered, preparing a hardmask composition. The monomer and the polymer had a weight ratio of 1:1.

Example 2

A hardmask composition was prepared according to Example 1 but using the monomer according to Synthesis Example 2 and mixing the monomer and the polymer in a weight ratio of 7:3.

Example 3

A hardmask composition was prepared according to Example 1 but using the monomer according to Synthesis Example 3 and mixing the monomer and the polymer in a weight ratio of 7:3.

Example 4

A hardmask composition was prepared according to Example 1 but using the monomer according to Synthesis Example 4 and mixing the monomer and the polymer in a weight ratio of 7:3.

Comparative Example 1

A hardmask composition was prepared according to the same method as Example 1 except for using no monomer.

Comparative Example 2

A hardmask composition was prepared according to the same method as Example 1 except for using no polymer.
Evaluation 1: Out-gas Evaluation
The hardmask compositions according to Examples 1 to 4 and Comparative Examples 1 and 2 were respectively spin-on coated to be about 2000 Å thick on a silicon wafer and baked at 300° C. for 5 minutes. Next, QCM (Quartz Crystal Microbalance) was used to measure out-gas produced during the process, and the amount of the out-gas (ng) was calculated according to the following Equation 1.

$$\Delta mass = \frac{-\Delta\ freq * A * \sqrt{\mu q * \rho q}}{2(Fq^2)}$$ [Equation 1]

Δmass=Mass change
Δfrequency=Resonant frequency change
A=Area of active surface (0.198 cm$^2$)
μq=AT-cut quartz constant (2.947×10$^{11}$ cm×s$^2$)
ρq=Quartz crystal density (2.65 g/cm$^3$)
Fq=Reference frequency (9.00 MHz)
The results are shown in Table 1.

TABLE 1

|  | Sublimate (ng) |
|---|---|
| Example 1 | 56 |
| Example 2 | 46 |
| Example 3 | 55 |
| Example 4 | 42 |
| Comparative Example 1 | 94 |
| Comparative Example 2 | 187 |

Referring to Table 1, while the hardmask compositions according to Examples 1 to 4 were baked to form a hardmask layer at a high temperature of 300° C., the out-gas was an amount of less than 60 ng, which shows that the high temperature process was stable. The hardmask compositions according to Comparative Examples 1 and 2 produced relatively more out-gas than the hardmask compositions according to Examples 1 to 4 and did not exhibit the same desirable properties as Examples 1 to 4 for the high temperature process.

Evaluation 2: Etching Resistance Evaluation

The hardmask compositions according to Examples 1 to 4 and Comparative Examples 1 and 2 were spin-on coated to be about 4000 Å thick on a silicon wafer and baked at 300° C. for 5 minutes. Next, the hardmask layers were respectively dry-etched by using $CHF_3/CF_4$ mixed gas and $N_2/O_2$ mixed gas, and their bulk etching rates were calculated to evaluate etching resistance.

The results are shown in Table 2.

TABLE 2

|  | Bulk etching rate (Å/sec) | |
|---|---|---|
|  | $N_2O_2$ etching | CFx etching |
| Example 1 | 23.28 | 24.20 |
| Example 2 | 22.87 | 24.89 |
| Example 3 | 23.23 | 25.75 |
| Example 4 | 21.96 | 25.20 |
| Comparative Example 1 | 28.54 | 31.02 |
| Comparative Example 2 | 24.14 | 26.53 |

Referring to Table 2, the hardmask compositions according to Examples 1 to 4 had improved bulk etching characteristics compared with the hardmask compositions according to Comparative Examples 1 and 2.

Evaluation 3: Gap-fill and Planarization Characteristics

The hardmask compositions according to Examples 1 to 4 and Comparative Examples 1 and 2 were applied on silicon wafers, baked at 300° C., and gap-fill and planarization characteristics were observed using V-SEM equipment.

The gap-fill characteristics were evaluated by observing the cross-sections of each pattern with a scanning electron microscope (SEM) and determining whether there was a void or not, and the planarization characteristics were evaluated based on the following Equation 2. In Equation 2, the less the difference between h1 and h2 is, the better the planarization characteristics are. Therefore, a smaller number indicates improved planarization characteristics.

$$\text{Planarization} = \left(1 - \frac{h_2}{h_1}\right) \times 100 \quad \text{[Equation 2]}$$

The results are shown in the following Table 3.

TABLE 3

|  | Planarization characteristics | | |
|---|---|---|---|
|  | (Aspect ratio 1:2) | (Aspect ratio 1:15) | Gap-fill characteristics (void generation) |
| Example 1 | 4.57 | 77.16 | None |
| Example 2 | 3.72 | 71.10 | None |
| Example 3 | 5.89 | 83.08 | None |
| Example 4 | 5.17 | 79.81 | None |
| Comparative Example 1 | 15.09 | 96.25 | Void generation |
| Comparative Example 2 | 10.64 | 89.71 | None |

Referring to Table 3, the hardmask compositions according to Examples 1 to 4 had excellent planarization characteristics under a condition of a relatively deeper pattern (aspect ratio=1:15). In addition, the hardmask compositions according to Examples 1 to 4 had no void and excellent gap-fill characteristics.

By way of summation and review, a hardmask layer may serve a role of an intermediate layer for transferring a fine pattern of a photoresist to a material layer through a selective etching process. Accordingly, the hardmask layer may desirably exhibit characteristics such as chemical resistance, etch resistance, or the like to tolerate multiple etching processes. Also, resistance for imaging radiation of a short wavelength is desired.

A spin-on coating method may use a hardmask composition having solubility in a solvent. The solubility has a relationship to gap-fill characteristics, to fill a hardmask composition in gaps between patterns, and planarization characteristics. Generally, as a molecular weight of a monomer for a hardmask composition is lowered, gap-fill characteristics become better. However, when the monomer for a hardmask composition has a low molecular weight, out-gas may be generated during a high temperature process.

As described above, embodiments may provide a hardmask composition that has low out-gas generation and provides etch resistance while having improved planarization characteristics. Embodiments may also provide a method of forming patterns using the hardmask composition, and a semiconductor integrated circuit device including patterns formed using the method.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A hardmask composition, comprising:
a monomer represented by the following Chemical Formula 1; and
an aromatic ring-containing polymer,

[Chemical Formula 1]

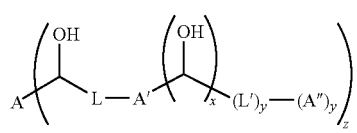

wherein, in the above Chemical Formula 1,
A, A' and A'' are each independently a substituted or unsubstituted aromatic cyclic group or aliphatic cyclic group, provided that at least one of the A and A' is a substituted or unsubstituted pyrene group, a substituted or unsubstituted perylene group, a substituted or unsubstituted benzoperylene group, a substituted or unsubstituted coronene group, or a combination thereof,
L and L' are each independently a single bond or a substituted or unsubstituted C1 to C6 alkylene group,
x=y=0 or x=y=1, and
z is an integer of 1 to 5.

2. The hardmask composition as claimed in claim 1, wherein at least one hydrogen of the A' or A" is substituted with a hydroxy group.

3. The hardmask composition as claimed in claim 1, wherein the monomer is represented by the following Chemical Formula 1-1, 1-2, or 1-3:

[Chemical Formula 1-1]

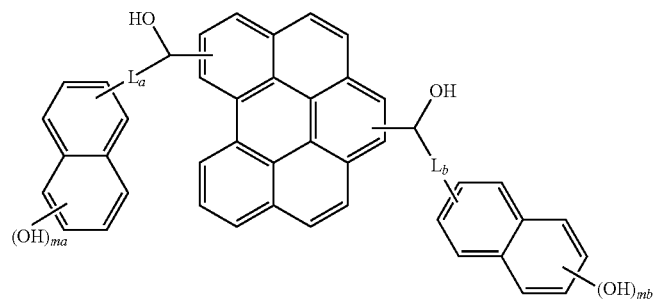

[Chemical Formula 1-2]

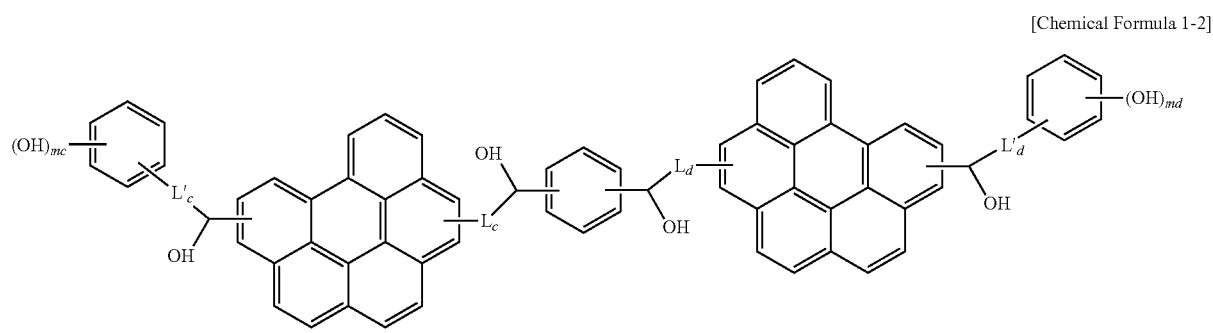

[Chemical Formula 1-3]

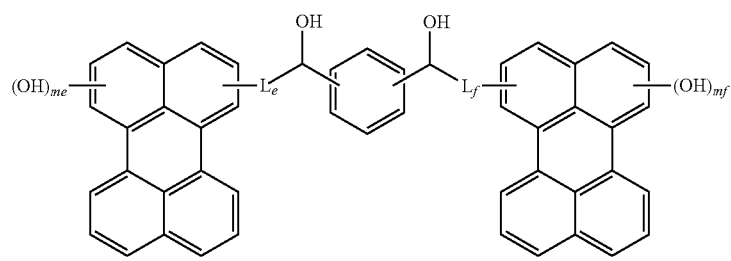

wherein the above Chemical Formulae 1-1, 1-2, and 1-3,
La, Lb, Lc, Ld, Le, Lf, L'c, and L'd are each independently a single bond or a substituted or unsubstituted C1 to C6 alkylene group,
ma and mb are each independently integers of 0 to 7,
mc and are each independently integers of 0 to 5, and
me and mf are each independently integers of 0 to 11.

4. The hardmask composition as claimed in claim 1, wherein the monomer is represented by the following Chemical Formula 1-1a, 1-1b, 1-2a, or 1-3a:

[Chemical Formula 1-1a]

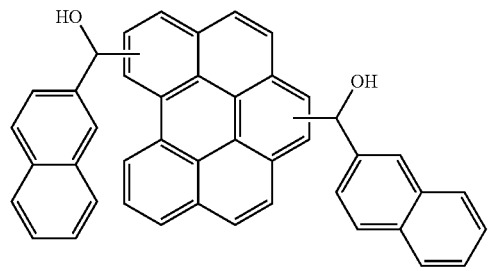

[Chemical Formula 1-1b]

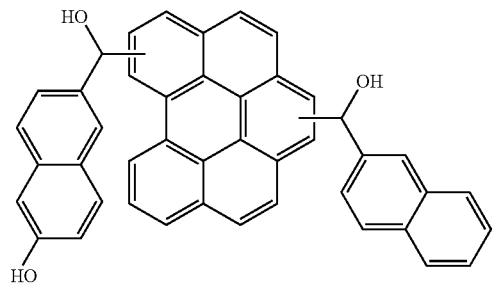

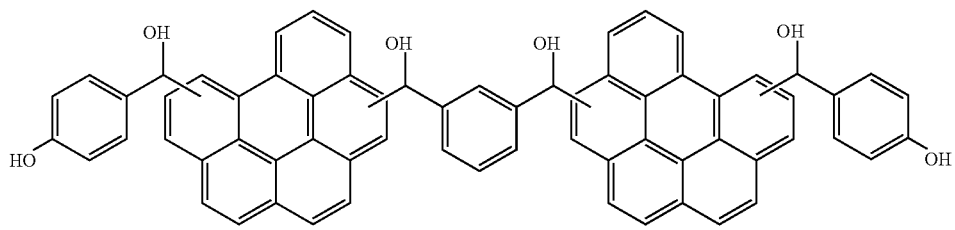

[Chemical Formula 1-2a]

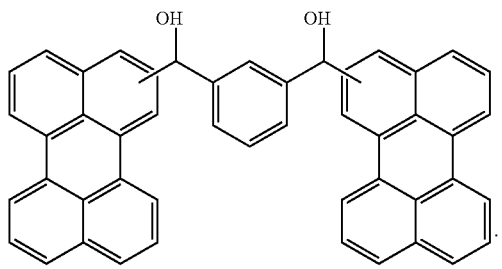

[Chemical Formula 1-3a]

5. The hardmask composition as claimed in claim 1, wherein the aromatic ring-containing polymer includes a moiety represented by the following Chemical Formula 2:

[Chemical Formula 2]

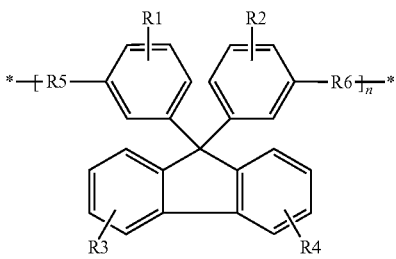

wherein, in the above Chemical Formula 2,
R1 to R4 are each independently hydrogen, a hydroxy group, a substituted or unsubstituted C1 to C20 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C20 alkoxy group, a halogen, a halogen-containing group, or a combination thereof,
R5 and R6 are each independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C7 to C20 arylalkylene group, a substituted or unsubstituted C1 to C20 heteroalkylene group, a substituted or unsubstituted C2 to C20 heterocycloalkylene group, or a combination thereof, and
n is 3 to about 200.

6. The hardmask composition as claimed in claim 1, further comprising a solvent, wherein the monomer and the aromatic ring-containing polymer are included in an amount of about 1 part by weight to about 40 parts by weight and about 1 part by weight to about 20 parts by weight, respectively, based on 100 parts by weight of the solvent.

7. The hardmask composition as claimed in claim 1, wherein the monomer and the aromatic ring-containing polymer are present at a weight ratio of monomer:polymer of about 1:1 to about 9:1.

8. The hardmask composition as claimed in claim 1, wherein the monomer has a molecular weight of about 500 to about 3,000.

9. The hardmask composition as claimed in claim 1, wherein the aromatic ring-containing polymer has a weight average molecular weight of about 1,000 to about 10,000.

10. The hardmask composition as claimed in claim 1, further comprising a solvent, wherein the solvent includes one or more of propyleneglycol monomethylether acetate, propyleneglycol monomethyl ether, cyclohexanone, or ethyl lactate.

11. A method of forming patterns, the method comprising:
providing a material layer on a substrate;
forming a hardmask layer on the material layer, forming the hardmask layer including applying the hardmask composition as claimed in claim 1 on the material layer;
forming a resist layer on the hardmask layer;
exposing and developing the resist layer to form a resist pattern;
selectively removing the hardmask layer using the resist pattern to expose a part of the material layer; and
etching an exposed part of the material layer.

12. The method as claimed in claim 11, wherein the hardmask composition is applied using a spin-on-coating method.

13. The method as claimed in claim 11, wherein, before forming the resist layer, a silicon-containing auxiliary layer is formed on the material layer.

14. The method as claimed in claim 11, wherein, before forming the hardmask layer, a bottom antireflective coating is formed.

15. A semiconductor integrated circuit device comprising a plurality of patterns manufactured according to the method as claimed in claim 11.

* * * * *